(12) United States Patent
Jeon

(10) Patent No.: US 8,778,808 B2
(45) Date of Patent: Jul. 15, 2014

(54) METHOD OF FABRICATING A SEMICONDUCTOR DEVICE

(75) Inventor: Kwang Seok Jeon, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 477 days.

(21) Appl. No.: 13/207,105

(22) Filed: Aug. 10, 2011

(65) Prior Publication Data

US 2011/0312173 A1 Dec. 22, 2011

Related U.S. Application Data

(62) Division of application No. 12/472,206, filed on May 26, 2009, now abandoned.

(30) Foreign Application Priority Data

May 26, 2008 (KR) .................... 10-2008-0048634

(51) Int. Cl.
*H01L 21/302* (2006.01)
*H01L 29/66* (2006.01)
*H01L 29/51* (2006.01)
*H01L 29/788* (2006.01)

(52) U.S. Cl.
CPC ...... *H01L 29/7881* (2013.01); *H01L 29/66825* (2013.01); *H01L 29/513* (2013.01)
USPC .................. 438/738; 257/E21.224

(58) Field of Classification Search
CPC ............ H01L 21/3213; H01L 21/3116; H01L 21/76814
USPC ......... 438/201, 211, 257, 593, 696, 738, 739, 438/906; 257/E21.224
See application file for complete search history.

(56) References Cited

U.S. PATENT DOCUMENTS 6,346,467 B1 * 2/2002 Chang et al. .................. 438/594
2009/0224307 A1 9/2009 Lee et al.

FOREIGN PATENT DOCUMENTS

| KR | 10-0551431 | 2/2006 |
| KR | 10-2006-0133166 | 12/2006 |
| KR | 10-0784860 | 5/2007 |

* cited by examiner

*Primary Examiner* — Quoc Hoang
(74) *Attorney, Agent, or Firm* — Marshall, Gerstein & Borun LLP

(57) ABSTRACT

The invention relates to semiconductor devices and a method of fabricating the same. In accordance with a method of fabricating a semiconductor device according to an aspect of the invention, a tunnel insulating layer, a first conductive layer, a dielectric layer, a second conductive layer, and a gate electrode layer are sequentially stacked over a semiconductor substrate. The gate electrode layer, the second conductive layer, the dielectric layer, and the first conductive layer are patterned so that the first conductive layer partially remains to prevent the tunnel insulating layer from being exposed. Sidewalls of the gate electrode layer are etched. A first passivation layer is formed on the entire surface including the sidewalls of the gate electrode layer. At this time, a thickness of the first passivation layer formed on the sidewalls of the gate electrode layer is thicker than that of the first passivation layer formed in other areas. A cleaning process is performed to thereby remove byproducts occurring in the etch process. A gate pattern is formed by etching the first passivation layer, the first conductive layer, and the tunnel insulating layer.

22 Claims, 5 Drawing Sheets

METHOD OF FABRICATING A SEMICONDUCTOR DEVICE

CROSS-REFERENCE TO RELATED APPLICATION

This is a division of U.S. application Ser. No. 12/472,206 filed May 26, 2009, which claims the priority benefit under USC 119 of KR 10-2008-0048634 filed May 26, 2008, the entire respective disclosures of which are incorporated herein by reference.

BACKGROUND OF THE INVENTION

The invention relates generally to semiconductor devices and a method of fabricating the same and, more particularly, to semiconductor devices and a method of fabricating the same, in which gate patterns are formed.

In general, in a flash memory semiconductor device, gate patterns are formed by patterning a conductive layer for a floating gate, a dielectric layer, a conductive layer for a control gate, and a gate electrode.

FIG. 1 is a sectional view of a semiconductor device for forming gate patterns of the device in the prior art.

Referring to FIG. 1, a tunnel insulating layer 11, a conductive layer for a floating gate 12, a dielectric layer 13, a conductive layer for a control gate 14, a gate electrode layer 15, and a hard mask layer 16 are sequentially stacked over a semiconductor substrate 10. The hard mask layer 16 is patterned and the gate electrode layer 15 is then patterned by an etch process using the patterned hard mask layer.

Generally, in the case in which a tungsten silicide ($WSi_x$) layer is used as a gate electrode layer in semiconductor devices of 50 nm or less, resistance (Rs) of word lines is increased due to a high resistivity of the tungsten silicide ($WSi_x$) layer itself, resulting in low program and read speeds. To solve the problem, the thickness of the tungsten silicide ($WSi_x$) layer must be increased. However, this method makes the process of patterning the word lines more difficult and may cause voids within isolation layers that electrically isolate the word lines. Accordingly, research has been done on a method of forming a gate electrode layer using a tungsten (W) layer having lower resistivity than the tungsten silicide ($WSi_x$) layer.

However, the tungsten layer is easily oxidized by a thermal process and easily corroded or oxidized and dissolved by a cleaning agent in a cleaning process. Accordingly, this method also greatly limits subsequent processes.

BRIEF SUMMARY OF THE INVENTION

The invention is directed to a semiconductor device and a method of fabricating the same, wherein in a gate pattern formation process using a tungsten (W) layer as a gate conductive layer, sidewalls of the tungsten layer are etched and a passivation layer is then formed on the tungsten layer to protect the sidewalls of the tungsten layer in a subsequent cleaning process, wherein the passivation layer is formed on etched portions of the tungsten layer, so that a distance between gates can be secured and process margin can be secured in a subsequent gap-fill process of insulating materials.

A semiconductor device according to an aspect of the invention includes a gate pattern in which a tunnel insulating layer, a conductive layer for a floating gate, a dielectric layer, a conductive layer for a control gate, and a gate electrode layer are sequentially stacked over a semiconductor substrate, a first passivation layer formed on sidewalls of the gate electrode layer, and a second passivation layer formed on the entire surface along a surface of the first passivation layer and the gate pattern. The critical dimension of the gate electrode layer is smaller than that of the conductive layer for the control gate.

The first passivation layer is formed on the sidewalls of the gate electrode layer and formed on the same line as that of the sidewalls of the gate pattern. The first passivation layer is formed from a nitride layer, and the second passivation layer is formed from an oxide layer. The second passivation layer includes a high-temperature oxide (HTO) layer, a low-pressure tetraethyl orthosilicate (LP-TEOS) layer, or an atomic layer deposition (ALD) oxide layer.

A method of fabricating a semiconductor device according to an aspect of the invention includes sequentially stacking a tunnel insulating layer, a first conductive layer, a dielectric layer, a second conductive layer, and a gate electrode layer over a semiconductor substrate, patterning the gate electrode layer, the second conductive layer, the dielectric layer, and the first conductive layer, wherein the first conductive layer partially remains to prevent the tunnel insulating layer from being exposed, etching sidewalls of the gate electrode layer, forming a first passivation layer on the entire surface including the sidewalls of the gate electrode layer, wherein first passivation layer formed on the sidewalls of the gate electrode layer is thicker than the first passivation layer formed in other areas, to prevent abnormal oxidization of the gate electrode layer, performing a cleaning process to remove byproducts resulting from the etch process of the gate electrode layer, and forming a gate pattern by etching the first passivation layer, the first conductive layer, and the tunnel insulating layer.

After the gate pattern is formed, a part of the first passivation layer and sidewalls of the second conductive layer preferably are oxidized by performing an oxidization process to form a second passivation layer.

The second passivation layer preferably is formed by oxidizing the first passivation layer formed on the sidewalls of the second conductive layer and the dielectric layer, and a part of the first passivation layer formed on the sidewalls of the gate conductive layer. The oxidization process preferably is performed to oxidize 30% to 80% of the first passivation layer formed on the sidewalls of the gate conductive layer to form the second passivation layer.

In the etching of the sidewalls of the gate electrode layer, the sidewalls of the gate electrode layer preferably are etched by 1 nm to 10 nm. The etching of the sidewalls of the gate electrode layer is performed using a dry etch process or a or wet etch process, wherein the wet etch process preferably is performed using $H_2SO_4$, $NH_4OH$, $H_2O$, HF, HCl, or $H_2O_2$, either alone or in combination.

The first passivation layer preferably is formed from a nitride layer. The first passivation layer preferably is formed to fill convex portions that have been generated in the process of etching the sidewalls of the gate conductive layer, so that a layer formed on the sidewalls of a conductive layer for a gate is thicker than a layer formed in the remaining areas. The first passivation layer preferably is formed using $SiH_4$, $Si_2H_6$, $Si_2HCl_2$, $NH_3$, $N_2$, Ar, He, or $PH_3$ gas, preferably in a pressure range of 0.05 Torr to 50 Torr. The first passivation layer preferably is formed to a thickness of 1 nm to 15 nm.

The second passivation layer preferably is formed to a thickness of 1 nm to 12 nm. The second passivation layer preferably is formed using a radical oxidization process.

A third passivation layer preferably is further formed over the semiconductor substrate including the second passivation layer. The third passivation layer preferably comprises an HTO layer, an LP-TEOS layer, or an ALD oxide layer.

A method of fabricating a semiconductor device according to another aspect of the invention includes sequentially stacking a tunnel insulating layer, a first conductive layer, a dielectric layer, a second conductive layer, and a gate electrode layer over a semiconductor substrate, patterning the gate electrode layer and the second conductive layer, wherein the second conductive layer partially remains to prevent the dielectric layer from being exposed, etching sidewalls of the gate electrode layer, forming a first passivation layer on the entire surface including the sidewalls of the gate electrode layer, to prevent abnormal oxidization of the gate electrode layer, performing a cleaning process to thereby remove byproducts occurring in the etch process of the gate electrode layer, and forming a gate pattern by etching the first passivation layer, the second conductive layer, and the dielectric layer, the first conductive layer, and the tunnel insulating layer.

After the gate pattern is formed, a second passivation layer preferably is formed over the semiconductor substrate including the gate pattern.

In etching of the sidewalls of the gate conductive layer, the sidewalls of the gate electrode layer preferably are etched by 1 nm to 13 nm. The etching of the gate electrode layer preferably is performed using a dry etch process or a wet etch process, wherein the wet etch process preferably is performed using $H_2SO_4$, $NH_4OH$, $H_2O$, HF, HCl, or $H_2O_2$, either alone or in combination.

The first passivation layer preferably comprises a nitride layer or a dual layer of a nitride layer and an oxide layer. The first passivation layer preferably is formed using $SiH_4$, $Si_2H_6$, $Si_2HCl_2$, $NH_3$, $N_2$, Ar, He, or $PH_3$ gas, preferably in a pressure range of 0.05 Torr to 50 Torr.

A second passivation layer preferably is further formed over the semiconductor substrate including the first passivation layer, wherein the second passivation layer preferably comprises an HTO layer, an LP-TEOS layer, or an ALD oxide layer.

The cleaning process preferably is performed using a wet cleaning process or a dry cleaning process employing HF, $NH_4OH$, $H_2SO_4$, either alone or in combination.

DESCRIPTION OF SPECIFIC EMBODIMENTS

Figure 1:
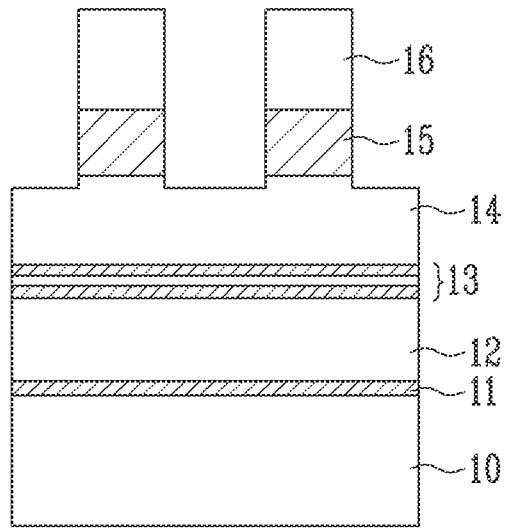
FIG. 1 is a sectional view of a semiconductor device for forming gate patterns of the device in the prior art.

Hereinafter, the invention is described in detail in connection with specific embodiments with reference to the accompanying drawings. The disclosed embodiments are provided to complete the disclosure of the invention and to allow those having ordinary skill in the art to understand the scope of the invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 2A to 2D are sectional views illustrating a method of fabricating a semiconductor device in accordance with a first embodiment of the invention.

Figure 2A:
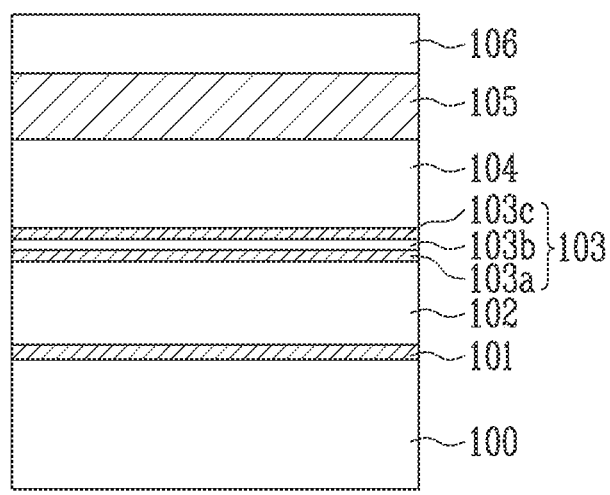
FIGS. 2A to 2D are sectional views illustrating a method of fabricating a semiconductor device in accordance with a first embodiment of the invention.

Referring to FIG. 2A, a tunnel insulating layer 101, a conductive layer for a floating gate 102, a dielectric layer 103, a conductive layer for a control gate 104, a gate electrode layer 105, and a hard mask layer 106 are sequentially stacked over a semiconductor substrate 100.

The conductive layer for the floating gate 102 and the conductive layer for the control gate 104 each preferably comprises a polysilicon layer. The dielectric layer 103 preferably has an ONO structure comprising a first oxide layer 103a, a nitride layer 103b, and a second oxide layer 103c. The gate electrode layer 105 preferably comprises a tungsten (W) layer.

The conductive layer for the floating gate 102 preferably comprises a dual layer structure, including an amorphous polysilicon layer not containing an impurity and a polysilicon layer containing an impurity.

Although not shown in the drawings, after the conductive layer for the control gate 104 is formed, a diffusion-prevention layer preferably is formed before the gate electrode layer 105 is formed.

The hard mask layer 106 preferably has a stack structure of an SiON layer, an oxide layer, a nitride layer, and an amorphous carbon layer.

Figure 2B:
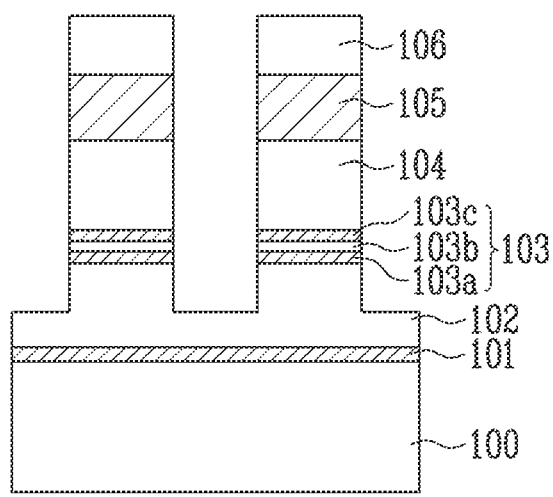

Referring to FIG. 2B, after a photoresist pattern is formed on the hard mask layer 106, an etch process using the photoresist pattern is performed. That is, the hard mask layer 106 is patterned.

The gate electrode layer 105, the conductive layer for the control gate 104, the dielectric layer 103, and a part of the conductive layer for the floating gate 102 are patterned by an etch process using the patterned hard mask layer 106 as an etch mask, thus forming primary gate patterns 103, 104, 105 and 106. Here, a part of the conductive layer for the floating gate 102 may remain so that the tunnel insulating layer 101 is not exposed.

Figure 2C:
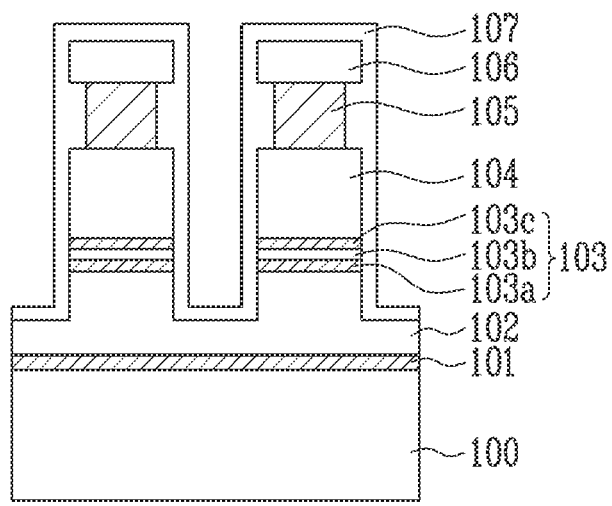

Referring to FIG. 2C, an etch process is performed to etch exposed sidewalls of the gate electrode layer 105.

The above etch process preferably is controlled in such a manner that the sidewalls of the gate electrode layer 105 are etched 1 nm to 10 nm. The etch process may be carried out using a dry or wet etch process. The wet etch process preferably is performed using $H_2SO_4$, $NH_4OH$, $H_2O$, HF, HCl, or $H_2O_2$, either alone or in combination. Accordingly, the width of the gate electrode layer 105 becomes narrower than that of the conductive layer for the control gate 104.

A first passivation layer 107 is formed on the conductive layer for the floating gate 102, including the primary gate patterns 103, 104, 105 and 106. The first passivation layer 107 preferably comprises a nitride layer. The first passivation layer 107 is formed to fill convex portions, which have been formed in the process of etching the sidewalls of the gate conductive layer 105, and is thicker than the first passivation layer 107 formed on other parts of the primary gate patterns 103, 104, 105 and 106 (for example, the sidewalls of the conductive layer for the control gate 104). The first passivation layer 107 preferably is formed using $SiH_4$, $Si_2H_6$, $Si_2HCl_2$, $NH_3$, $N_2$, Ar, He, or $PH_3$ gas, preferably in a pressure range of 0.05 Torr to 50 Torr. The first passivation layer 107 preferably is formed to a thickness of 1 nm to 15 nm.

Next, a cleaning process preferably is performed to remove byproducts, which occur in (i.e., result from) the etch process for forming the primary gate patterns 103, 104, 105, and 106. The cleaning process preferably is performed using a wet or dry cleaning process employing HF, $NH_4OH$, $H_2SO_4$, either alone or in combination. Byproducts are removed through the cleaning process, which can prohibit the occurrence of a bird's beak phenomenon of the dielectric layer 103 and the tunnel insulating layer 101. At the time of the cleaning process, the gate electrode layer 105 is protected by the first passivation layer 107, thus prohibiting an abnormal oxidization phenomenon.

Figure 2D:
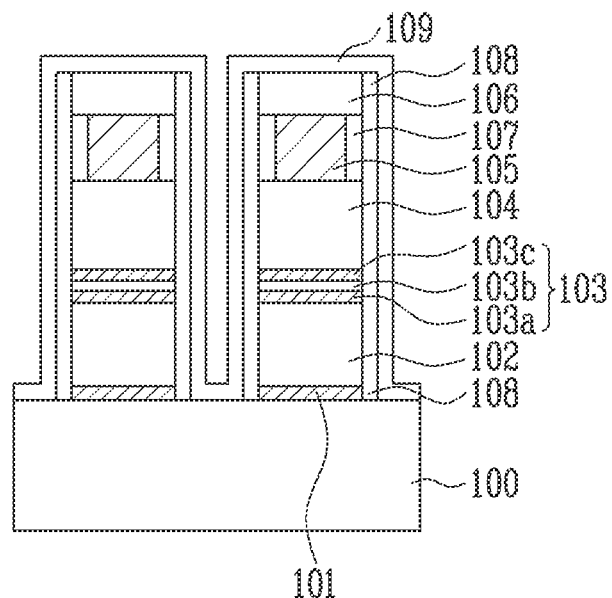

Referring to FIG. 2D, the first passivation layer 107 formed on the remaining conductive layer for the floating gate 102, the conductive layer for the floating gate 102, and the tunnel insulating layer 101 are etched by an etch process, thus forming secondary gate patterns 101, 102, 103, 104, 105, and 106. The first passivation layer formed on the hard mask pattern 106 is removed by the above etch process.

The first passivation layer formed on the sidewalls of the secondary gate patterns 101, 102, 103, 104, 105, and 106, and the sidewalls of the conductive layer for the floating gate 102 are oxidized by performing an oxidization process, thus forming a second passivation layer 108. At this time, the first passivation layer 107 formed on the sidewalls of the gate conductive layer 105 is thicker than the first passivation layer formed on other areas (that is, the hard mask pattern 106, the sidewalls of the conductive layer for the control gate 104, and the sidewalls of the dielectric layer 103). Accordingly, only a part of the first passivation layer (refer to 107 of FIG. 2C) is oxidized through the oxidization process, thereby forming the second passivation layer 108. The second passivation layer 108 preferably is formed by oxidizing 30% to 80% of the total thickness of the first passivation layer (refer to 107 of FIG. 2C). The second passivation layer 108 preferably is formed to a thickness of 1 nm to 12 nm. The oxidization process preferably employs a radical oxidization process and preferably is performed in such a manner that a uniform second passivation layer 108 is formed on the sidewalls of the gate patterns by controlling the degree of oxidation of a nitride layer and a polysilicon layer to be 1:0.7 to 1:1.3.

A third passivation layer 109 is formed on the entire surface of the semiconductor substrate 100 including the second passivation layer 108. The third passivation layer 109 may be formed from an HTO layer, an LP-TEOS layer, or an ALD oxide layer. In the case in which the third passivation layer 109 is formed from the HTO layer, it may be preferred that a mixed gas of silane-based gas, such as $SiH_4$, $Si_2H_6$ or $SiH_2Cl_2$, and $O_2$ gas be used.

The first to third passivation layers 107, 108, and 109 function to prohibit oxidization of the gate electrode layer 105 due to heat occurring in subsequent processes, thus improving device characteristics.

FIGS. 3A to 3D are sectional views illustrating a method of fabricating a semiconductor device in accordance with a second embodiment of the invention.

Figure 3A:
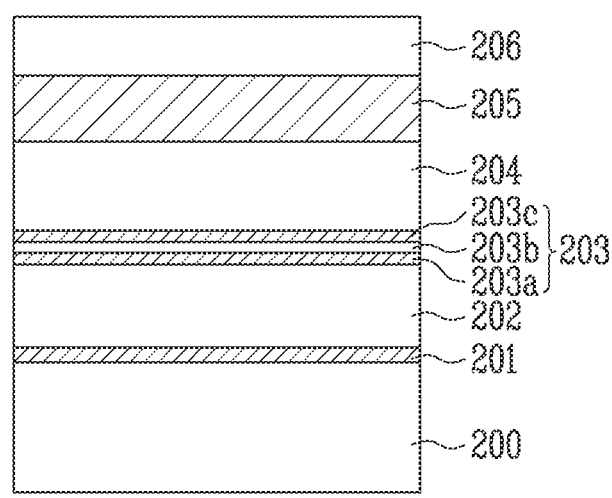
FIGS. 3A to 3D are sectional views illustrating a method of fabricating a semiconductor device in accordance with a second embodiment of the invention.

Referring to FIG. 3A, a tunnel insulating layer 201, a conductive layer for a floating gate 202, a dielectric layer 203, a conductive layer for a control gate 204, a gate electrode layer 205, and a hard mask layer 206 are sequentially stacked over a semiconductor substrate 200.

Each of the conductive layer for the floating gate 202 and the conductive layer for the control gate 204 preferably comprises a polysilicon layer. The dielectric layer 203 preferably has an ONO structure comprising a first oxide layer 203a, a nitride layer 203b, and a second oxide layer 203c. The gate electrode layer 205 preferably comprises a tungsten (W) layer.

The conductive layer for the floating gate 202 preferably comprises a dual layer structure, including an amorphous polysilicon layer not containing an impurity and a polysilicon layer containing an impurity.

Although not shown in the drawings, after the conductive layer for the control gate 204 is formed, a diffusion-prevention layer may be formed before the gate electrode layer 205 is formed.

The hard mask layer 206 preferably has a stack structure of an SiON layer, an oxide layer, a nitride layer, and an amorphous carbon layer.

Figure 3B:
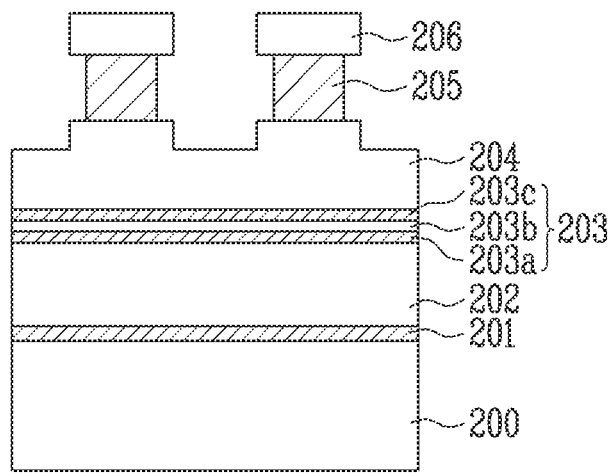

Referring to FIG. 3B, after a photoresist pattern is formed on the hard mask layer 206, an etch process using the photoresist pattern is performed. That is, the hard mask layer 206 is patterned.

The gate electrode layer 205 and the conductive layer for the control gate 204 are patterned by an etch process using the patterned hard mask layer 206 as an etch mask, thus forming primary gate patterns 206 and 205. Here, a part of the conductive layer for the control gate 204 preferably remains to prevent the dielectric layer 203 from being exposed.

An etch process is then performed to etch exposed sidewalls of the gate electrode layer 205.

The above etch process preferably is controlled in such a manner that the sidewalls of the gate electrode layer 205 are etched 1 nm to 13 nm. The etch process preferably is carried out using a dry etch process or a wet etch process. The wet etch process preferably is performed using $H_2SO_4$, $NH_4OH$, $H_2O$, HF, HCl, or $H_2O_2$, either alone or in combination. Accordingly, the width of the gate electrode layer 205 becomes narrower than that of the conductive layer for the control gate 204.

Figure 3C:
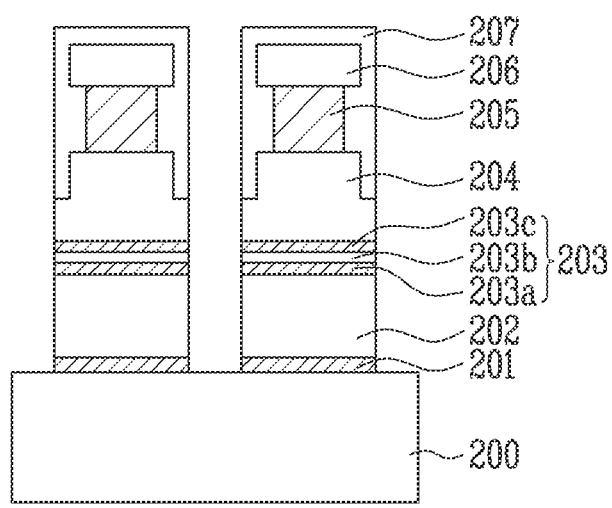
Figure 3D:
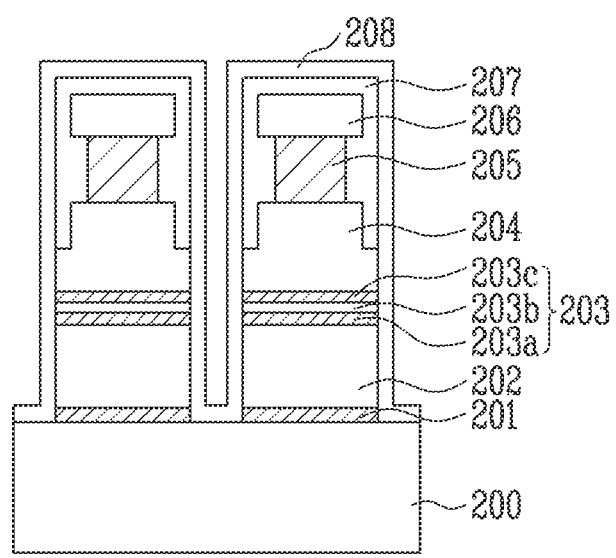

Referring to FIG. 3C, a first passivation layer 207 is formed on the conductive layer for the control gate 204, including the primary gate patterns 206 and 205. The first passivation layer 207 preferably comprises a nitride layer or a dual layer of a nitride layer and an oxide layer. The first passivation layer 207 preferably is formed using $SiH_4$, $Si_2H_6$, $Si_2HCl_2$, $NH_3$, $N_2$, Ar, He, or $PH_3$ gas, preferably in a pressure range of 0.05 Torr to 50 Torr.

Next, a cleaning process preferably is performed to remove byproducts, which result from the etch process for forming the primary gate patterns 206 and 205. The cleaning process preferably is performed using a wet or dry cleaning process employing HF, $NH_4OH$, or $H_2SO_4$, either alone or in combination. Byproducts are removed through the cleaning process, which can prohibit the occurrence of a bird's beak phenomenon of the dielectric layer 203 and the tunnel insulating layer 201 in subsequent processes. At the time of the cleaning process, the gate electrode layer 205 is protected by the first passivation layer 207, thus prohibiting an abnormal oxidization phenomenon.

The first passivation layer 207, the conductive layer for the control gate 204, the dielectric layer 203, the conductive layer for the floating gate 202, and the tunnel insulating layer 201 are etched to thereby form secondary gate patterns 206, 205, 204, 203, 202, and 201.

A selective oxidization process preferably is performed to mitigate etch damage occurring at the time of the etch process. The selective oxidization process preferably is performed using a mixed $O_2$, $H_2$ gas.

A second passivation layer 208 is formed over the semiconductor substrate 100, including the secondary gate patterns 206, 205, 204, 203, 202, and 201. The second passivation layer 208 preferably comprises an HTO layer, an LP-TEOS layer, or an ALD oxide layer. In the case in which the second passivation layer 208 comprises an HTO layer, it may be preferred that a mixed gas of silane-based gas, such as $SiH_4$, $Si_2H_6$ or $SiH_2Cl_2$, and $O_2$ gas be used. The second passivation layer 208 preferably comprises a nitride layer.

The first and second passivation layers 207, 208 function to prohibit oxidization of the gate electrode layer 205 due to heat occurring in subsequent processes, thus improving device characteristics.

In accordance with the embodiments of the invention, in a gate pattern formation process using a tungsten (W) layer as a gate conductive layer, sidewalls of the tungsten layer are etched and a passivation layer is then formed on the tungsten layer to protect the sidewalls of the tungsten layer in a subsequent cleaning process. Here, the passivation layer is formed on etched portions of the tungsten layer. Accordingly, a distance between gates can be secured and process margin can be secured in a subsequent gap-fill process of insulating materials.

The embodiments disclosed herein have been proposed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A method of fabricating a semiconductor device, comprising:
    sequentially stacking a tunnel insulating layer, a first conductive layer, a dielectric layer, a second conductive layer, and a gate electrode layer over a semiconductor substrate, the gate electrode layer defining sidewalls;
    patterning the gate electrode layer, the second conductive layer, the dielectric layer, and the first conductive layer, wherein the first conductive layer partially remains to prevent the tunnel insulating layer from being exposed;
    etching the sidewalls of the gate electrode layer;
    forming a first passivation layer on the entire surface including the sidewalls of the gate electrode layer, wherein the first passivation layer formed on the sidewalls of the gate electrode layer is thicker than the first passivation layer formed in other areas;
    performing a cleaning process to remove byproducts resulting from the etch process of the gate electrode layer; and
    forming a gate pattern by etching the first passivation layer, the first conductive layer, and the tunnel insulating layer.

2. The method of claim 1, further comprising, after forming the gate pattern, oxidizing a part of the first passivation layer and sidewalls of the second conductive layer by performing an oxidization process, thus forming a second passivation layer.

3. The method of claim 2, comprising forming the second passivation layer by oxidizing the first passivation layer formed on the sidewalls of the second conductive layer and the dielectric layer, and a part of the first passivation layer formed on the sidewalls of the gate conductive layer.

4. The method of claim 2, comprising performing the oxidization process to oxidize 30% to 80% of the first passivation layer formed on the sidewalls of the gate conductive layer to form the second passivation layer.

5. The method of claim 2, wherein the second passivation layer is formed to a thickness of 1 nm to 12 nm.

6. The method of claim 2, comprising forming the second passivation layer using a radical oxidization process.

7. The method of claim 2, further comprising forming a third passivation layer over the semiconductor substrate including the second passivation layer, wherein the third passivation layer comprises a high-temperature oxide (HTO) layer, a low-pressure tetraethyl orthosilicate (LP-TEOS) layer, or an atomic layer deposition (ALD) oxide layer.

8. The method of claim 1, comprising in etching the sidewalls of the gate electrode layer, etching the sidewalls of the gate electrode layer by 1 nm to 10 nm.

9. The method of claim 1, comprising etching the sidewalls of the gate electrode layer using a dry etch process or a wet etch process, wherein the wet etch process comprises using $H_2SO_4$, $NH_4OH$, $H_2O$, HF, HCl, or $H_2O_2$, either alone or in combination.

10. The method of claim 1, wherein the first passivation layer comprises a nitride layer.

11. The method of claim 1, comprising forming the first passivation layer to fill convex portions that have been generated in the process of etching the sidewalls of the gate conductive layer, so that a layer formed on the sidewalls of a conductive layer for a gate is thicker than a layer formed in the remaining areas.

12. The method of claim 1, comprising forming the first passivation layer using $SiH_4$, $Si_2H_6$, $Si_2HCl_2$, $NH_3$, $N_2$, Ar, He, or $PH_3$ gas in a pressure range of 0.05 Torr to 50 Torr.

13. The method of claim 1, comprising forming the first passivation layer to a thickness of 1 nm to 15 nm.

14. The method of claim 1, comprising performing the cleaning process using a wet cleaning process or a dry cleaning process in either case employing HF, $NH_4OH$, or $H_2SO_4$, either alone or in combination.

15. A method of fabricating a semiconductor device, comprising:
    sequentially stacking a tunnel insulating layer, a first conductive layer, a dielectric layer, a second conductive layer, a gate electrode layer, and a hard mask pattern over a semiconductor substrate, the gate electrode layer defining sidewalls;
    patterning the hard mask pattern, the gate electrode layer and the second conductive layer, wherein the second conductive layer partially remains to prevent the dielectric layer from being exposed;
    etching the sidewalls of the gate electrode layer, wherein a critical dimension of the gate electrode layer is smaller than a critical dimension of the hard mask pattern;
    forming a first passivation layer on the entire surface including the sidewalls of the gate electrode layer;
    performing a cleaning process to thereby remove byproducts resulting from the etch process of the gate electrode layer; and
    forming a gate pattern by etching the first passivation layer, the second conductive layer, and the dielectric layer, the first conductive layer, and the tunnel insulating layer.

16. The method of claim 15, further comprising, after forming the gate pattern, forming a second passivation layer over the semiconductor substrate including the gate pattern.

17. The method of claim 15, comprising in etching the sidewalls of the gate conductive layer, etching the sidewalls of the gate electrode layer by 1 nm to 13 nm.

18. The method of claim 15, comprising etching the gate electrode layer using a dry or wet etch process, wherein the wet etch process is performed using $H_2SO_4$, $NH_4OH$, $H_2O$, HF, HCl, or $H_2O_2$, either alone or in combination.

19. The method of claim 15, wherein the first passivation layer comprises a nitride layer or a dual layer of a nitride layer and an oxide layer.

20. The method of claim 15, comprising forming the first passivation layer using $SiH_4$, $Si_2H_6$, $Si_2HCl_2$, $NH_3$, $N_2$, Ar, He, or $PH_3$ gas and in a pressure range of 0.05 Torr to 50 Torr.

21. The method of claim 15, further comprising forming a second passivation layer over the semiconductor substrate including the first passivation layer from a high-temperature oxide (HTO) layer, a low-pressure tetraethyl orthosilicate (LP-TEOS) layer, or an atomic layer deposition (ALD) oxide layer.

22. The method of claim 15, comprising performing the cleaning process using a wet cleaning process or a dry cleaning process in either case employing HF, $NH_4OH$, or $H_2SO_4$, either alone or in combination.

* * * * *